United States Patent [19]

Scepanovic et al.

[11] Patent Number: 5,898,597
[45] Date of Patent: Apr. 27, 1999

[54] INTEGRATED CIRCUIT FLOOR PLAN OPTIMIZATION SYSTEM

[75] Inventors: Ranko Scepanovic, San Jose, Calif.; Alexander E. Andreev, Moskovskaga Oblast, Russian Federation; Ivan Pavisic, Cupertino, Calif.

[73] Assignee: LSI Logic Corporation, Milpitas, Calif.

[21] Appl. No.: 08/798,652

[22] Filed: Feb. 11, 1997

[51] Int. Cl.$^6$ .................................................. G06F 17/50
[52] U.S. Cl. ........................................... 364/491; 364/490
[58] Field of Search ................................. 364/488–491, 364/578

[56] References Cited

U.S. PATENT DOCUMENTS

| | | | |
|---|---|---|---|
| 5,491,641 | 2/1996 | Scepanovic et al. | 364/491 |
| 5,495,419 | 2/1996 | Rostoker et al. | 364/468 |
| 5,557,533 | 9/1996 | Koford et al. | 364/491 |
| 5,568,322 | 10/1996 | Azami et al. | 359/689 |
| 5,568,636 | 10/1996 | Koford | 395/500 |
| 5,578,840 | 11/1996 | Scepanovic et al. | 257/207 |
| 5,615,128 | 3/1997 | Scepanovic et al. | 364/489 |
| 5,636,125 | 6/1997 | Rostoker et al. | 364/468.28 |
| 5,638,293 | 6/1997 | Scepanovic et al. | 364/491 |
| 5,640,327 | 6/1997 | Ting | 364/488 |
| 5,661,663 | 8/1997 | Scepanovic et al. | 364/490 |
| 5,682,322 | 10/1997 | Boyle et al. | 364/491 |
| 5,699,265 | 12/1997 | Scepanovic et al. | 364/491 |
| 5,712,793 | 1/1998 | Scepanovic et al. | 364/490 |
| 5,742,510 | 4/1998 | Rostoker et al. | 364/468.03 |
| 5,745,363 | 4/1998 | Rostoker et al. | 364/468.28 |
| 5,757,657 | 5/1998 | Hathaway et al. | 364/491 |

OTHER PUBLICATIONS

Schulz ("Hierarchical physical design system", IEEE Comput. Soc. Press, Proceedings on VLSI and Computer Peripherals: VLSI and Microelectronic Applications in Intelligent Peripherals and their Interconnection Networks, May 8, 1989, pp. 5/20–24).

Wu et al. ("Glue–logic partitioning for floorplans with a rectilinear datapath", IEEE Comput. Soc. Press, Proceedings of the European Conference on Design Automation, Feb. 25, 1991, pp. 162–166).

*Primary Examiner*—Kevin J. Teska
*Assistant Examiner*—Phallaka Kik

[57] ABSTRACT

A method for planning floor allocation of an integrated circuit to each function is disclosed. To provide enough core space to each of the functions and to meet some cost functions such as space utilization requirement of each of the functions, the disclosed method divides the core space to a grid of elementary regions. Then, pieces of the core space are defined and the pieces containing the borders and the overlapping areas of the functions are identified. Then, the identified pieces are used shift the allocated capacities of the functions as to shift excess capacity or core space from the functions with excess capacity to the functions with a shortage of capacity.

20 Claims, 8 Drawing Sheets

INTEGRATED CIRCUIT FLOOR PLAN OPTIMIZATION SYSTEM

BACKGROUND OF THE INVENTION

1. Field of the Invention

The present invention generally relates to the art of microelectronic integrated circuit layout, and more specifically to the art of placement of cells on integrated circuit chips.

2. Description of Related Art

Microelectronic integrated circuits consist of a large number of electronic components which are fabricated by layering several different materials on a silicon base or wafer. The design of an integrated circuit transforms a circuit description into a geometric description which is known as a layout. A layout consists of a set of planar geometric shapes in the various layers of the silicon chip.

The process of converting the specifications of an electrical circuit into a layout is called physical design. Physical design requires arranging elements, wires, and predefined cells on a fixed area, and the process can be tedious, time consuming, and prone to many errors due to tight tolerance requirements and the minuteness of the individual components, or cells.

Currently, the minimum geometric feature size of a component is on the order of 0.5 microns. Feature size may be reduced to 0.1 micron within the next several years. The current small feature size allows fabrication of as many as 10 million transistors or approximately 1 million gates of logic on a 25 millimeter by 25 millimeter chip. This feature-size-decrease/transistor-increase trend is expected to continue, with even smaller feature geometries and more circuit elements on an integrated circuit. Larger chip sizes will allow far greater numbers of circuit elements.

Due to the large number of components and the exacting details required by the fabrication process, physical design is not practical without the aid of computers. As a result, most phases of physical design use extensively Computer Aided Design (CAD) tools. Automation of the physical design process has increased the level of integration, reduced turn around time and enhanced chip performance.

The object of physical chip design is to determine an optimal arrangement of devices in a plane and to find an efficient interconnection or routing scheme between the devices that results in the desired functionality. Since space on the chip surface is at a premium, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnection wire network, or net. A purpose of the optimization process used in the physical design stage is to determine a cell placement such that all of the required interconnections can be made, but total wirelength and interconnection congestion are minimized.

Typical methods for achieving this goal include generating one or more initial placements and modifying the placement or placements using optimization methodologies such as simulated annealing, genetic algorithms (i.e. simulated evolution), and force directed placement. Each of these techniques involve iterative applications of the respective algorithms to arrive at an estimate of the optimal arrangement of the cells.

Depending on the input, placement algorithms are classified into two major groups, constructive placement algorithms and iterative improvement algorithms. The input to the constructive placement algorithms consists of a set of blocks along with the netlist. The algorithm provides locations for the blocks. Iterative improvement algorithms start with an initial placement. These algorithms modify the initial placement in search of a better placement. The algorithms are applied in a recursive or an iterative manner until no further improvement is possible, or the solution is considered to be satisfactory based on certain predetermined criteria.

Iterative placement algorithms can be divided into three general classifications: simulated annealing, simulated evolution and force directed placement. The simulated annealing algorithm simulates the annealing process that is used to temper metals. Simulated evolution simulates the biological process of evolution, while the force directed placement simulates a system of bodies attached by springs.

Assuming that a number N of cells are to be optimally arranged and routed on an integrated circuit chip, the number of different ways that the cells can be arranged on the chip, or the number of permutations, is equal to N! (N factorial). In the following description, each arrangement of cells will be referred to as a placement. In a practical integrated circuit chip, the number of cells can be hundreds of thousands or millions. Thus, the number of possible placements is extremely large.

Because of the large number of possible placements, computerized implementation of the placement algorithms discussed above can take many days. In addition, the placement algorithm may need to be repeated with different parameters or different initial arrangements to improve the results.

Iterative algorithms function by generating large numbers of possible placements and comparing them in accordance with some criteria which is generally referred to as fitness. The fitness of a placement can be measured in a number of different ways, for example, overall chip size. A small size is associated with a high fitness and a large size is associated with a low fitness. Another measure of fitness is the total wire length of the integrated circuit. A high total wire length indicates low fitness and a low total wire length, on the other hand, indicates high fitness. One cell placement optimization system is described in U.S. patent application Ser. No. 08/672,725. Applicants hereby incorporate the specification, including the drawings, of said application herein as though set forth in full.

The relative desirability of various placement configurations can alternatively be expressed in terms of cost, which can be considered as the inverse of fitness, with high cost corresponding to low fitness and, similarly, low cost corresponding to high fitness.

The cost or the desirability of various placement configuration can be measured using other methods such as capacity distribution and utilization ratio. Capacity distribution and utilization ratios measure the placement of the cells for each of the functional blocks for the integrated circuit. An integrated circuit is designed with various functional blocks, or functions, which, operating together, achieves the desired operation. Each of the functions of the circuit is implemented by a plurality of cells and is assigned a portion of the core space upon which the cells are placed. For example, an integrated circuit design may require the use of a central processor unit (CPU) function, memory function, and some type of input/output (I/O) function.

In this document, the terms and phrases "core," "core space," "core area," "floor," "floor space," and "integrated circuit," will be used interchangeably to refer to the area of the integrated circuit upon which cells are placed to implement various functions of the integrated circuit.

The capacity is the maximum amount of cells which can be placed on the core space or any portion of the core space and is usually measured in cell height units. Provided that entire core space has sufficient capacity, it is often desirable to place the cells on the core space with a certain capacity distribution. For instance, it may be desirable that the cells of the integrated circuit be distributed evenly throughout the chip to avoid high concentration of the cells in a small location with a low concentration of the cells for the rest of the core space. On the other hand, it may be desirable to implement certain functions of the chip on a small portion of the core space with a high concentration of the cells. In sum, a predetermined capacity distribution of the core space or for any function assigned to a portion of the core space may be one of the requirements of the cell placement.

A closely related concept is the utilization of the space. The utilization is the ratio of the amount of the actual core space use within a predefined portion of the core space to the capacity of the core space for the predefined portion of the core space. For example, if a portion of the core space assigned to a function has a capacity of 100,000 cell height units, and the cells to implement the function uses 50,000 cell height units, then the utilization of the portion of the core space is 50 percent.

The capacity distribution or the utilization ratio for each of the functions of the integrated circuit or for the entire core space may be predetermined as an engineering parameter based on such factors as heat dissipation, power management, manufacturing constraints, etc.

An exemplary integrated circuit chip is illustrated in FIG. 1 and generally designated by the reference numeral 10. The circuit 10 includes a semiconductor substrate 10A on which are formed a number of functional circuit blocks that can have different sizes and shapes.

As illustrated by FIG. 1, the functions such as the central processing unit (CPU) 12, Read Only Memory (ROM) 14 and the others are assigned portions of the integrated chip 10. Some functions are assigned to a relatively large portion of the core space. These are the CPU 12, the ROM, (ROM) 14, a clock/timing unit 16, one or more random access memories (RAM) 18 and an input/output (I/O) interface unit 20.

The integrated circuit 10 further comprises a large number of small cells 22 which can number tens of thousands, hundreds of thousands, or even millions or more. These cells 22 may implement various functions of the integrated circuit. For example, a group of cells of a sub-area 28 may represent an implementation of a function to prepare data for the I/O function 20.

Although not visible in the drawing, the various elements of the circuit 10 are interconnected by electrically conductive lines or traces that are routed, for example, through vertical channels 24 and horizontal channels 26 that run between the cells 22.

The current methods of optimally placing the cells on the integrated circuit involve (1) assigning functions to be implemented to portions of the integrated circuit; (2) placing the cells of each of the functions onto the assigned portion of the integrated circuit using a placement algorithm; (3) calculating the capacity distribution of the integrated circuit and the utilization rate of each portion of the integrated circuit used to implement its function; and (4) iterating the first three steps to obtain a better placement in terms of capacity distribution or utilization.

The disadvantages of the current process involve time and accuracy. Because the placement process requires manual iteration between floor planing tools (to calculate and evaluate capacity and utilization) and placement tools (to newly place the cells onto the core), the optimal placement process takes a long time. Also, is difficult to manually optimize many different parameters simultaneously because, at each iteration, the operator has to simultaneously consider many parameters—overall capacity, capacity distribution, overall utilization, utilization of each functions, utilization distribution, overlap size among functions, aspect ratio of functions, etc. Even with highly experience professionals, the simultaneous consideration of all of the parameters for an optimal cell placement is an extremely difficult process. Further, the complexity of the cell placement process is continually increasing as the number of functions and the number of cells on integrated chips increase, rendering manual analysis techniques to become nearly impossible to perform.

In summary, because of the ever-increasing complexity of integrated circuit chips and the number of cells required to implement the functions of the complex designs, the manual placement optimization methods are fast becoming obsolete. The manual floor planning and cell placement optimization process requires an inordinate amount of time because the process requires manual iteration between running floor plan tools and placement tools. In additional, it is extremely difficult, at best, for human beings to simultaneously optimize several parameters (function utilization, overlap size among functions, aspect ratios of functions, etc.).

SUMMARY OF THE INVENTION

To overcome the difficulties of the current floor planning techniques, the floor planning method and apparatus disclosed in this specification provides for a method to optimize a given floorplan automatically while meeting required capacity distribution and utilization. The disclosed new floor planning technique achieves almost uniform utilization of the chip by optimally using the overlap and border regions of the functions while satisfying the given floorplan constraints.

According to the present invention, there is provided a method of allocating floor space of an integrated circuits chips to functions of the chip comprising the steps of partitioning the IC into a grid comprising a plurality of regions; defining pieces, where each piece comprises at least one of the regions, and each piece having a capacity; and allocating said capacity of each of said pieces to a plurality of functions.

In addition, after the allocation of the capacity of the pieces to the functions, the sufficiency of the allocated capacities are analyzed for each of the functions. Then, the capacities of the pieces are reallocated to shift excess capacities from the functions with excess capacities to the functions with a shortage of space.

An apparatus for allocating floor space of an integrated circuit (IC) chip, comprising a processor and memory. The memory contains instructions for the processor to partition the IC into a grid comprising a plurality of regions; to define pieces, each piece having a capacity; and to allocate said capacity of each of said pieces to a plurality of functions. The apparatus may include other components such as a monitor and a harddrive to store information regarding the location of the pins, net routing requirements, etc. The memory may also include other instructions for the processor such as instructions to shift or to reallocate the capacity of the pieces to other functions.

The present invention also includes a computer storage medium that stores a plurality of executable instructions for instructing a processor to allocate floor space of an integrated circuit. The instructions comprise the steps to partition the IC into a grid of regions; to define pieces, each piece having a capacity; and to allocate the capacity of each of the pieces to the functions.

These and other aspects, features, and advantages of the present invention will be apparent to those persons having ordinary skilled in the art to which the present invention relates from the foregoing description and the accompanying drawings.

DETAILED DESCRIPTION OF THE PREFERRED EMBODIMENT(S)

Step One: Assign Portions of the Core Space to the Functions.

Figure 1:
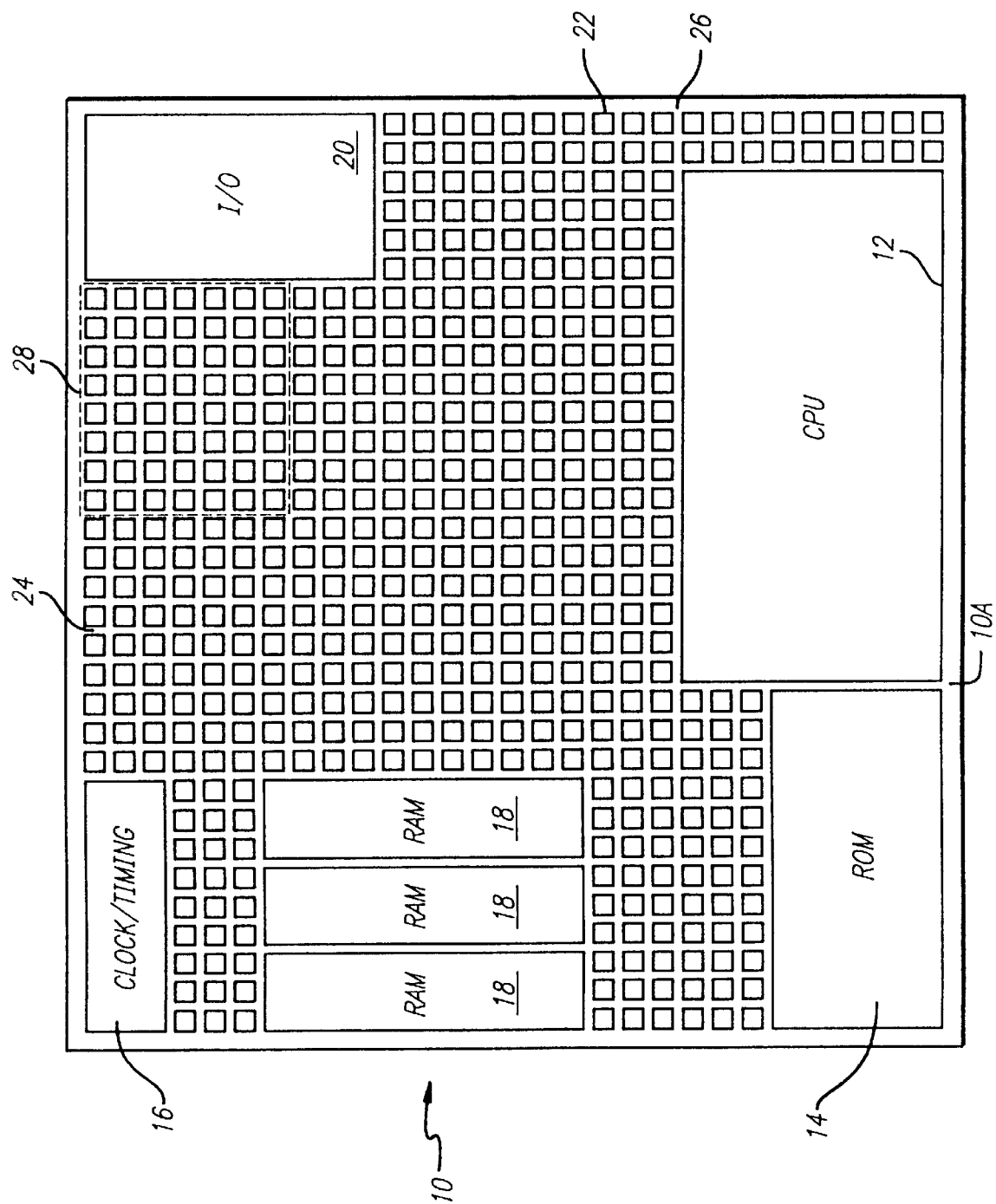
FIG. 1 is an illustration of an exemplary integrated circuit chip.
Figure 2:
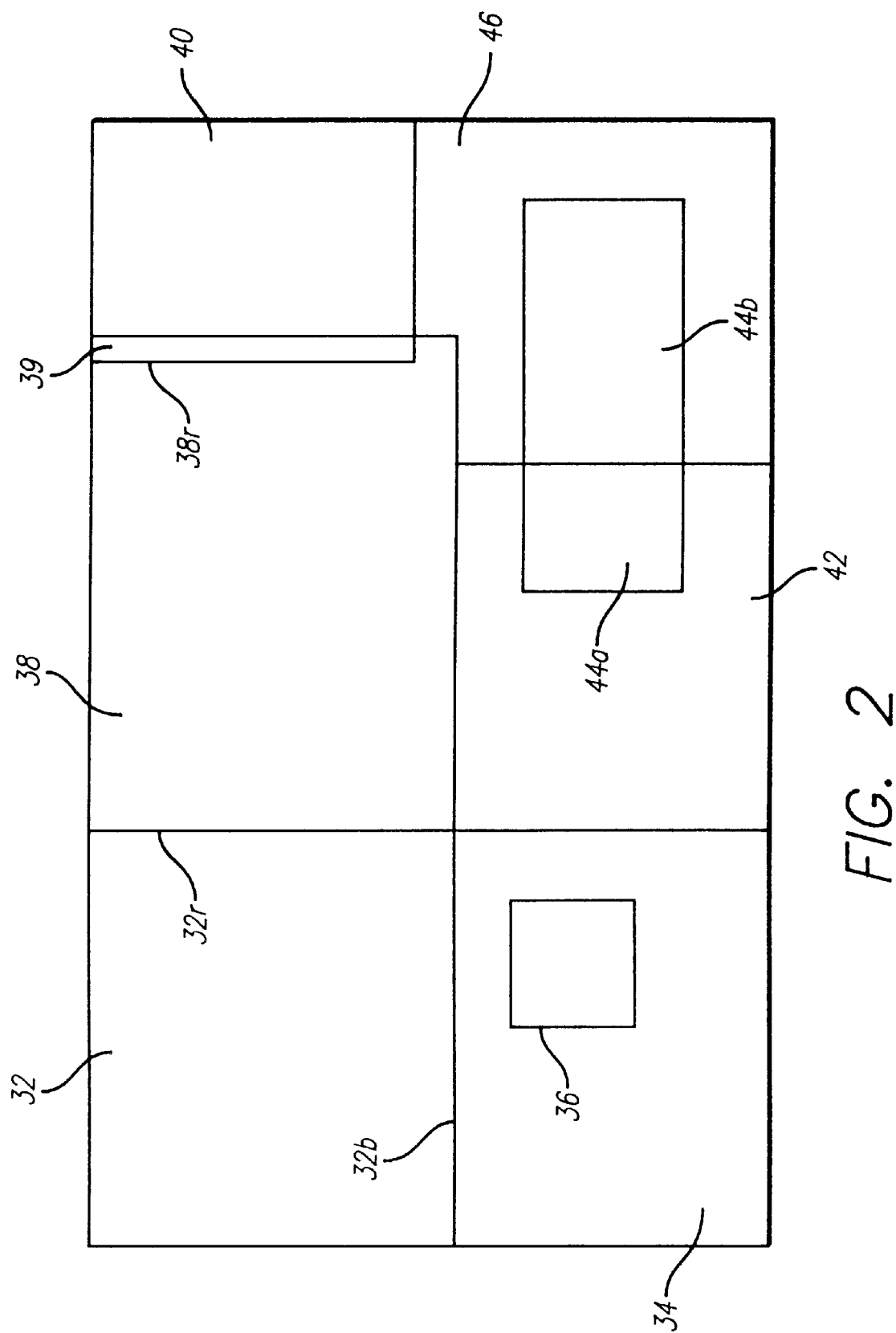
FIG. 2 illustrates an example of a possible assignment of core space area to various functions.

Referring to FIG. 2, the first step of the cell placement optimization method is to assign portions of core space 30 to the functions of the integrated circuit. For illustration, this specification will use an example of an integrated circuit design with eight (8) functions denoted as f1, f2, f3, f4, f5, f6, f7, and f8.

The assignment of the functions to the portions of core space 30 is made in a manner designed to minimize some specific cost function. The cost function may require uniform space utilization over the entire floor. For example, a cost function may require that each function utilize 70% of its assigned area. Another cost function may require that each function meet a predetermined level of utilization of the floor assigned to the function. For instance, a cost function may require f1 to utilize 70% of its assigned area and f2 to utilized 80% of its assigned area. This second example cost function describes the general case for which the first example cost function is a special case. For the purposes of our discussion, the second, the more general cost function, will be further discussed and considered.

In our example, the eight functions are assigned to the portions of the core space 30 as shown by Table 1 below.

TABLE 1

| Function: | f1 | f2 | f3 | f4 | f5 | f6 | f7 | f8 |
|---|---|---|---|---|---|---|---|---|
| Reference Number of the Assigned Portion of the Core Space 30 as illustrated in FIG. 2 | 32 | 34 | 36 | 38–39 | 39–40 | 42 | 44a–44b | 46 |

Some portions border each other while other portions overlap. Core portion 32, assigned to f1, borders core portions 34 and 38 assigned to functions f2 and f4 respectively. Portion 38-39 (combination of portions 38 and 39) is assigned to f4 and overlaps portion 39-40 (combination of portions 39 and 40) assigned to f5.

The border area and the overlap areas will be used by the method of the present invention to optimally place cells such that the capacity distribution and utilization requirements are met. As described below, the bordering and the overlapping areas are used to shift the capacities of the functions assigned to the bordering and overlapping portions of the core space to create additional capacity for placing the cells of the functions with a shortage of capacity. For example, suppose the capacity of the core portion 38-39 is 25,000 cell height units, but only 20,000 cell height units are required to implement f4. The excess 5,000 cell capacity of the portion 38-39 can be reassigned to f1, whose assigned core portion 32 borders the portion 38-39, or to f5, whose assigned core portion 39-40 overlaps the portion 38-39.

When the excess capacity of portion 38-39 (assigned to function f4) is shifted, or reassigned, to portion 32 (f1) is shifted to then the cells of function f1 can cross the order 32r to be placed within portion 38-39.

Likewise, f5 (portion 39-40) can be implemented to use the excess 5,000 cell height unit capacity of portion 38-39 (f4) by moving the cells of f4 out from, and moving the cells of f5 into, the overlap area 39. The technique of using the common overlapping area to shift excess capacity from one portion assigned to a function to anther portion can be used, in addition to the border-encroachment method discussed in the previous paragraph, to control the capacity distribution and utilization.

Moreover, the capacity-shifting technique using the bordering and the overlapping regions, can be employed to shift excess capacity from one portion (function) of the integrated circuit to another portion of the integrated circuit even when the two portions do not share a border or an overlapping area. For example, if portion 36 (assigned to f3) has a shortage of capacity, then the access capacity of portion 38-39 (f4) can be shifted to compensate for the shortage by first shifting the excess capacity of f4 to f1 (portion 32), thereby creating access capacity for f1. Then, the access capacity of f1 can be shifted to f2 (portion 34). Finally, the access capacity of f2 can be shifted to f3 (portion 36) for the shortage.

The details of the implementation of the shifting technique will be discussed below.

Step Two: Define Regions.

Figure 3:
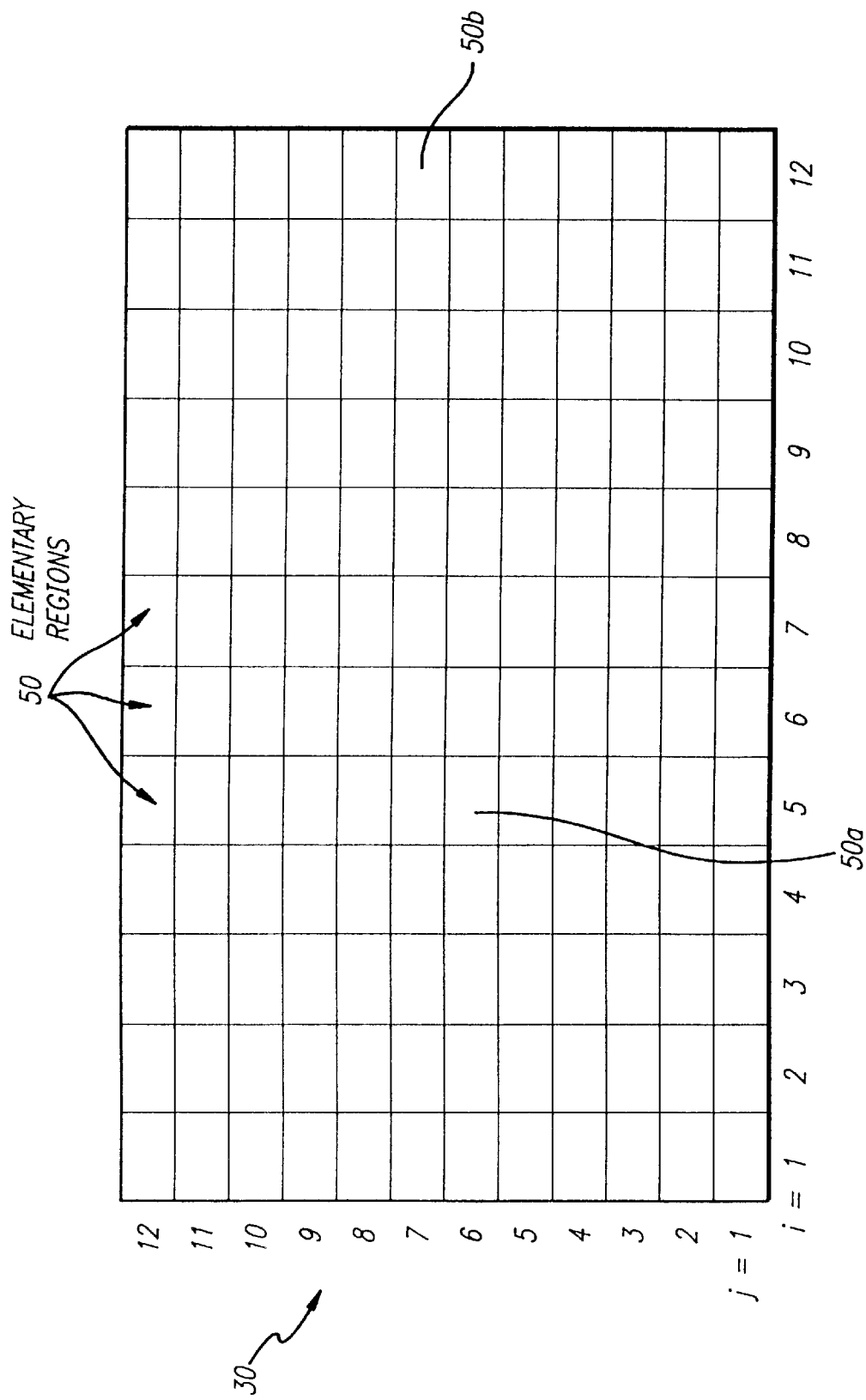
FIG. 3 illustrates a partitioning of core space according to one embodiment of the present invention.

Referring now to FIG. 3, once the functions of the integrated circuit are assigned specific portions (31, 34, 36, 38-39, 39-40, 42, 44a, 44b, and 46) of the core space 30, the core space is partitioned into a grid of elementary regions 50. FIG. 3 shows the core space 30 being partitioned into a grid of twelve rows by twelve columns containing 144 elementary regions 50. For simplicity, only three elementary regions 50 are referenced, and each of the elementary regions, or regions, will be referred to as $R_{i,j}$ where i is the column and j is the row on which the region $R_{i,j}$ is located. For instance, region 50a is referred to as $R_{5,6}$ and region 50b, $R_{12,7}$.

Figure 4:
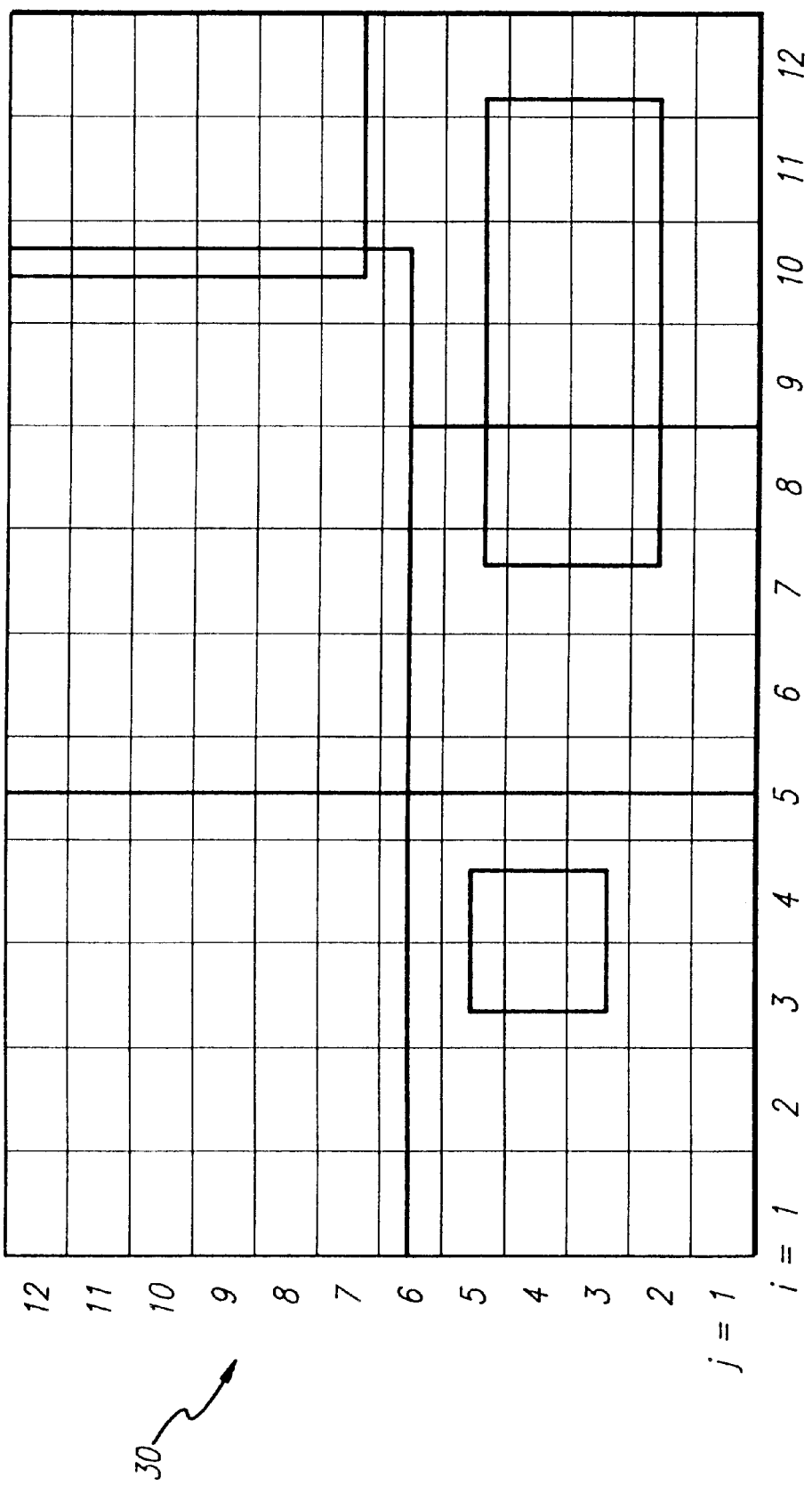
FIG. 4 illustrates the relationship between the partitioning grid and a function-area assignment layout.

Each region is assigned to each of the portions which takes space from the region. FIG. 4 shows the relationship between the regions and the portions of the core space. As the table illustrates, in contrast to the one-to-one relationship between functions and portions, there is a one-to-many relationship between portions and the regions.

Figure 5:
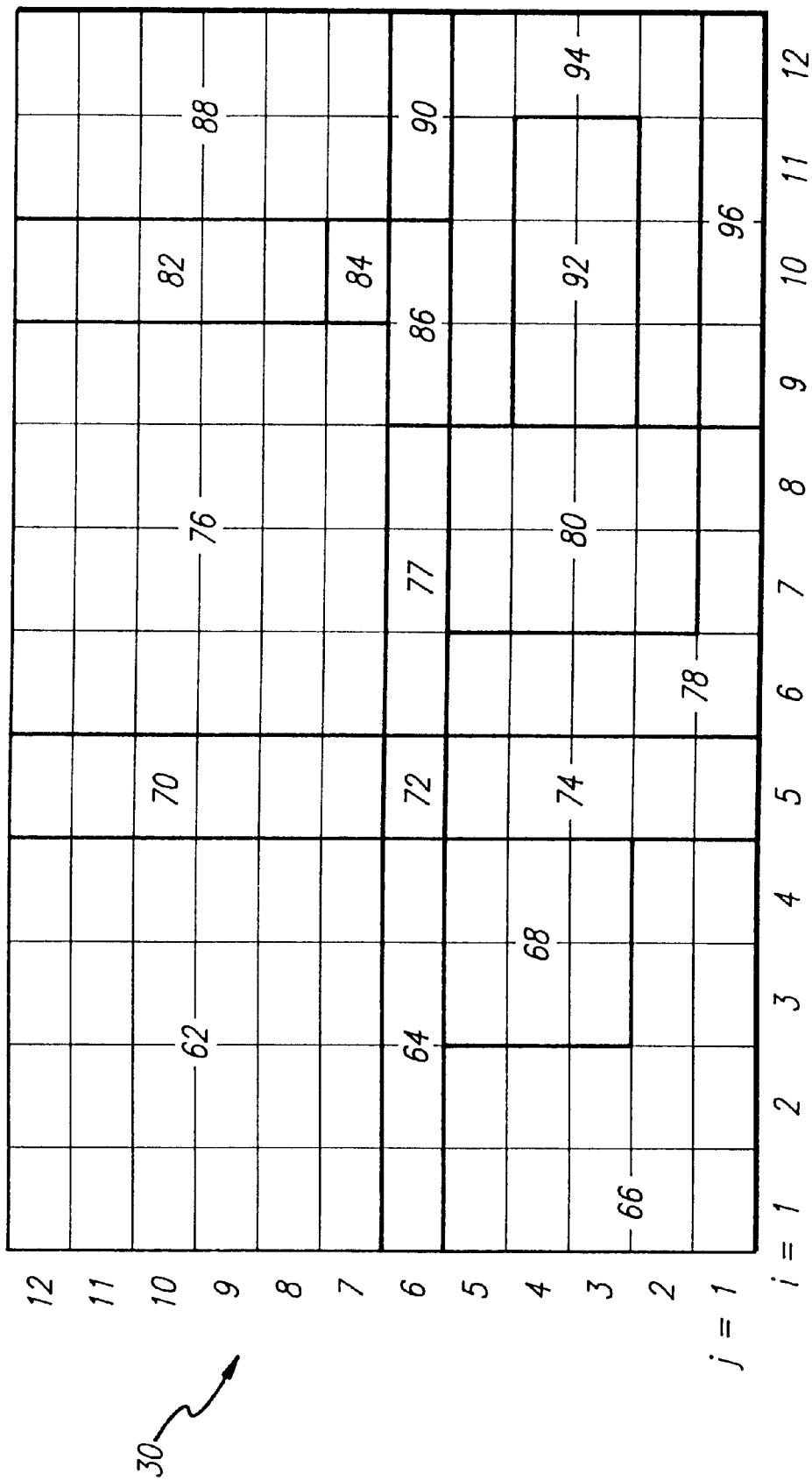
FIG. 5 illustrates the definition of pieces of the core space according to one embodiment of the present invention.

If a border between two or more portions lies within a region, then the region is assigned to all of the portions which have its border within the region. For instance, as illustrated by FIGS. 2, 4, and 5, and by Table 2 below, $R_{5,6}$ is assigned to portions 32 (f1), 34 (f2), 38 (f4), and 42 (f6). Table 2 below partially lists the functions of the integrated circuit, the portions assigned to the listed function, and the regions assigned to the listed portions.

TABLE 2

| Function | Assigned Portion | Assigned Elementary Regions |
|---|---|---|
| f1 | 32 | $R_{1,12}, R_{2,12}, R_{3,12}, R_{4,12}, R_{5,12},$ $R_{1,11}, R_{2,11}, R_{3,11}, R_{4,11}, R_{5,11},$ $R_{1,10}, R_{2,10}, R_{3,10}, R_{4,10}, R_{5,10},$ $R_{1,9}, R_{2,9}, R_{3,9}, R_{4,9}, R_{5,9},$ $R_{1,8}, R_{2,8}, R_{3,8}, R_{4,8}, R_{5,8},$ $R_{1,7}, R_{2,7}, R_{3,7}, R_{4,7}, R_{5,7},$ $R_{1,6}, R_{2,6}, R_{3,6}, R_{4,6}, R_{5,6}$ |
| f2 | 34 | $R_{1,6}, R_{2,6}, R_{3,6}, R_{4,6}, R_{5,6},$ $R_{1,5}, R_{2,5}, R_{3,5}, R_{4,5}, R_{5,5},$ $R_{1,4}, R_{2,4}, R_{3,4}, R_{4,4}, R_{5,4},$ $R_{1,3}, R_{2,3}, R_{3,3}, R_{4,3}, R_{5,3},$ $R_{1,2}, R_{2,2}, R_{3,2}, R_{4,2}, R_{5,2},$ $R_{1,1}, R_{2,1}, R_{3,1}, R_{4,1}, R_{5,1}$ |
| ... | ... | |
| f8 | 46 | $R_{10,6}, R_{11,6}, R_{12,6},$ $R_{9,5}, R_{10,5}, R_{11,5}, R_{12,5},$ $R_{12,4},$ $R_{12,3},$ $R_{9,2}, R_{10,2}, R_{11,2}, R_{12,2},$ $R_{9,1}, R_{10,1}, R_{11,1}, R_{12,1}$ |

Step Three: Define the Pieces.

Figure 6:
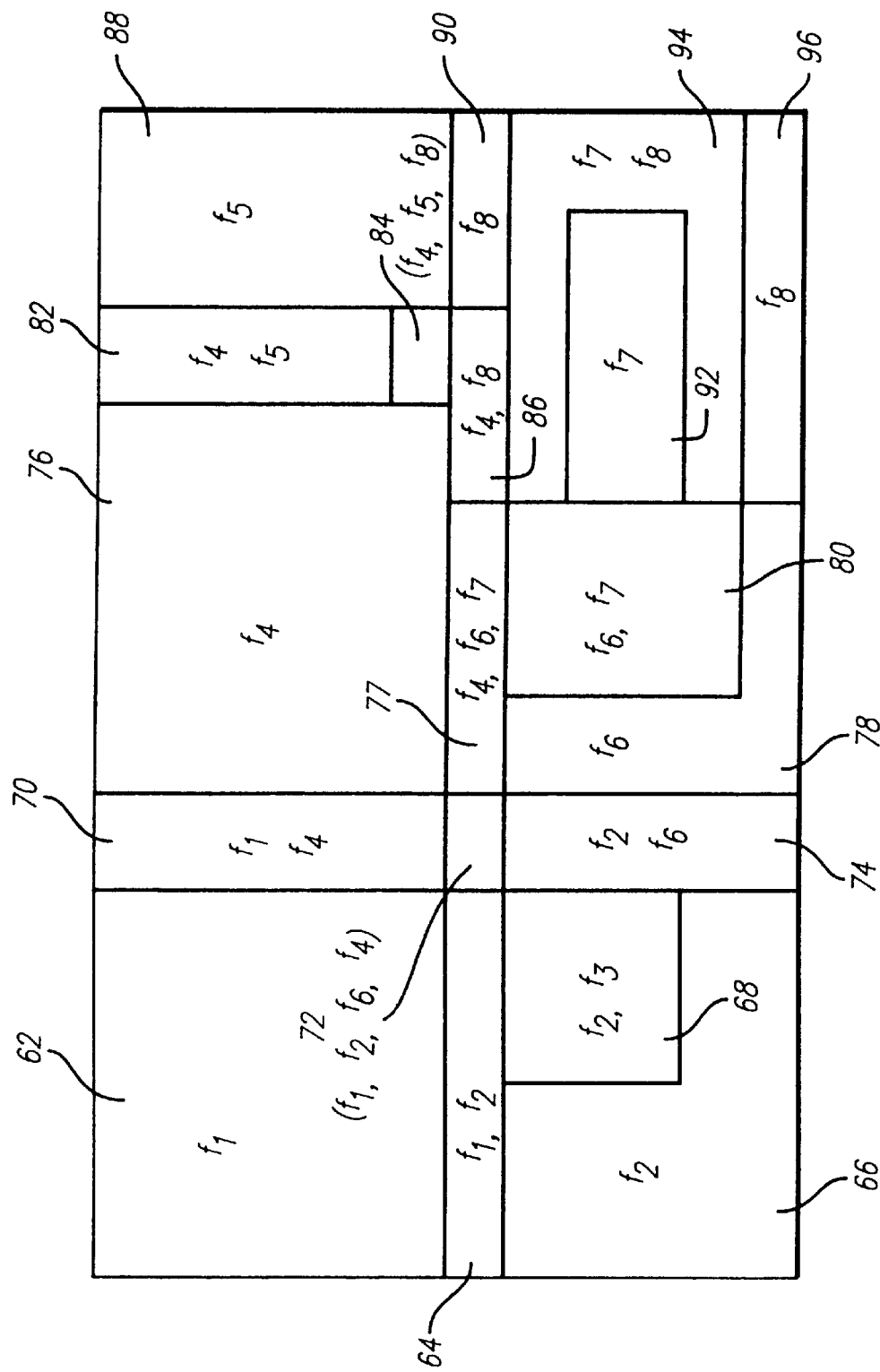
FIG. 6 illustrates the pieces of the core space according to one embodiment of the present invention.

Referring to FIGS. 5 and 6, after partitioning the core region 30 into a grid of elementary regions 50, the elementary regions 50 are grouped into pieces, each piece being defined as a set of regions 50 assigned to the same function or the same set of functions. Typically, a piece of the IC comprises a set of adjacent regions as illustrated by the figures of this specification; however, adjacency of the regions is not required to define a piece.

FIG. 5 illustrates the relationship between the pieces and the regions of the core space, and Table 3 below partially lists the pieces of the core space and the regions comprising each of the listed pieces. FIG. 6 shows all of the pieces of the integrated circuit 30 for the example illustrated by FIGS. 2–5. For clarity of discussion, the pieces are referred to Pnn where nn is the reference number of the piece as illustrated by FIG. 6.

TABLE 3

| Piece reference according to FIGS. 5 and 6 | Elementary Regions comprising the Piece |
|---|---|
| P62 | $R_{1,12}, R_{2,12}, R_{3,12}, R_{4,12},$ $R_{1,11}, R_{2,11}, R_{3,11}, R_{4,11},$ $R_{1,10}, R_{2,10}, R_{3,10}, R_{4,10},$ $R_{1,9}, R_{2,9}, R_{3,9}, R_{4,9},$ |

TABLE 3-continued

| Piece reference according to FIGS. 5 and 6 | Elementary Regions comprising the Piece |
|---|---|
| P64 | $R_{1,8}, R_{2,8}, R_{3,8}, R_{4,8},$ $R_{1,7}, R_{2,7}, R_{3,7}, R_{4,7}$ $R_{1,6}, R_{2,6}, R_{3,6}, R_{4,6}$ |
| ... | ... |
| P96 | $R_{9,1}, R_{10,1}, R_{11,1}, R_{12,1}$ |

For convenience, the following expressions are used:

$\Im$ set of all pieces of the core;

$\Im(f)$ set of all pieces from which the portion of the core assigned to function $f$ may take some space.

Referring to FIG. 6, in our example, $\Im$={P62, P64, P66, P68, P70, P72, P74, P76, P77, P78, P80, P82, P84, P86, P88, P90, P92, P94, P96}. Table 4 below lists the $\Im(f)$ for some of the functions of the example integrated circuit.

TABLE 4

| Set | Members of the Set (FIG. 6 reference numbers to the pieces) |
|---|---|
| $\Im(f1)$ | P62, P64, P70, P72 |
| $\Im(f2)$ | P64, P66, P68, P72, P74 |
| ... | ... |
| $\Im(f8)$ | P86, P90, P94, P96 |

As shown by FIGS. 5 and 6 and by Tables 3 and 4, piece P62 comprises all elementary regions belonging to f1 only. Piece 64 comprises elementary regions each of which belongs to both f1 and f2. Note that a piece can comprise only a single elementary region. For instance, piece P72 comprises only one elementary region $R_{5,6}$ which belong to functions f1, f2, f4, and f6.

Each of the pieces has a capacity, or a maximum number of cells which can be placed in the core space defined by the piece. If a piece is assigned to a single portion (assigned to a function) of the core space, then entire capacity of the piece is available to the portion (i.e., to accommodate the cells of the function assigned to that portion); however, a piece, such as P70, can be assigned to two or more portions, each portion representing a function. In such a case, the capacity of the piece is divided and allocated to the functions to which the piece belongs. Therefore, the following notation is used to express the capacity of a piece assigned to a portion, which, in turn, is assigned to a function:

$X_{f,P}$=the capacity assigned to function f in piece P

For example, if piece P64 has capacity for 4,000 cell height units, then $X_{f1,P64}$ may be 1,000 cell height units while $X_{f2,P64}$ may be 3,000 cell height units.

Step Four: Define Capacity and Utilization Requirements

A cell placement is acceptable when the placement results in a predetermined level of utilization for each of the portions assigned to the functions of the circuit.

To place the cells with a built in factor to achieve the predetermined level of utilization, the cells are given fictive heights prior to being placed on the core space. The fictive height of a cell is the height of the cell used to calculate the space, or the number of cell height units, required to place the cell on the core space.

The actual height of a cell is usually measured in millimicrons. Because all of the standard cells have the same width, the cell height is usually used as the measure of capacity as well has the height of the cell.

For example, if a function's target utilization rate is fifty percent, then the cells of the function should be placed on the core space such that the cells actually use fifty percent of the space provided for the cells on the core space. That is, when the cells of the function are placed on the core space, the ratio between the actual amount of the capacity used by the cells divided by the amount of the capacity taken up by or reserved for the cells must be fifty percent. Alternatively expressed, the utilization ratio determines the density of the space taken up to place the cells of the function.

Therefore, if a function's target utilization rate is 50%, and the function is implemented by using two cells C1 and C2 with cell heights of four (4) and six (6) units, respectively, then the fictive heights of each of the cells is set to eight (8) and twelve (12), respectively. The result is that when the cells C1 and C2 are placed, they take up twenty (20) cell height units while actually using ten (10) cell height units, or the fifty percent of the space taken up. At this point, the following definition becomes useful:

hh(f)=the sum of all fictive heights of all cells of the function f.

For each piece of the core space, the following may be defined:

cap(P)=the capacity of the piece P.

Then, to meet the predetermined capacity distribution and utilization requirements, the following two expressions must be satisfied:

Expression (A) cap(P)=sum of all $X_{f,P}$ where P is a member of $\Im(f)$, for all P's of the circuit;

Expression (B) hh(f)≦sum of all $X_{f,P}$ where P is a member of $\Im(f)$, for all functions of the circuit.

Expression (A) states that, for each piece P, the capacity of the piece, cap(P), must equal to the sum of $X_{f,P}$ for all functions f to which P is a member. For example, referring to FIGS. 5 and 6, the capacity of P64 (piece 64), cap(64), must equal the capacity of P64 assigned to f1 and f2. Alternatively expressed, cap(64)=$X_{f1,P64}$+$X_{f2,P64}$.

If cap(P) is less than the sum of all $X_{f,P}$ for any of the pieces, then the capacity of the P, cap(P), is over-allocated, and the placement of the core space is not possible. To remedy the situation, the capacities of the pieces must be reallocated to the functions. On the other hand, if cap(P) is greater than the sum of all $X_{f,P}$ for any of the pieces, then the capacity of P, cap(P), is under-allocated, meaning that some core space of the piece is not allocated to any of the functions.

If the capacity allocations, $X_{f,P}$, for all of the pieces of the core space meet Expression (A), then a feasible cell placement, or a solution, exists for a valid cell placement. If the capacity allocations, $X_{f,P}$, does not meet Expression (A) for any piece of the core space, then a feasible cell placement does not exist. In the latter case, a feasible solution does not exist because not meeting Expression (A) means that the sum of the capacities of the functions assigned to the piece exceeds the actual capacity of the piece itself.

Expression (B) states that, for each function, the sum of the fictive heights of all the cells of the function must be less than or equal to the sum of the capacities the function is assigned in each of the piece in which the function is assigned capacities. For example, referring to FIGS. 4 and 6, the sum of the fictive heights of all of the cells of f1 (assigned to portion 32, which comprises P62, P64, P70, and P72) must be less than or equal to the sum of the capacities of f1 in P62, P64, P70, and P72. That is, hh(f1)≦$X_{f1,P62}$+$X_{f1,P64}$+$X_{f1,P70}$+$X_{f1,P72}$.

If the sum of all fictive heights of all the cells of the function is greater than the sum of all the capacities of the function in each of its pieces, then there is insufficient amount of the core pace to place the cells of the function.

In summary, if Expression (A) is not satisfied, then a solution is not feasible. In such a case, for a feasible placement solution, the functions must be reassigned to different portions of the core space, the pieces may be redefined, or the capacities of the pieces may be reallocated to the functions until Expression (A) is met. When Expression (A) is met, then a feasible cell placement exists, and Expression (B) is analyzed. If Expression (B) is met for a given cell placement, then the placement is a correct, and the processing stops. If Expression (B) is not met, then the following steps, Step Five, Step Six, and Step Seven, are followed to shift, or reallocate, the capacities of the pieces to meet Expression (B).

Step Five: Construct the Graph.

Figure 7:
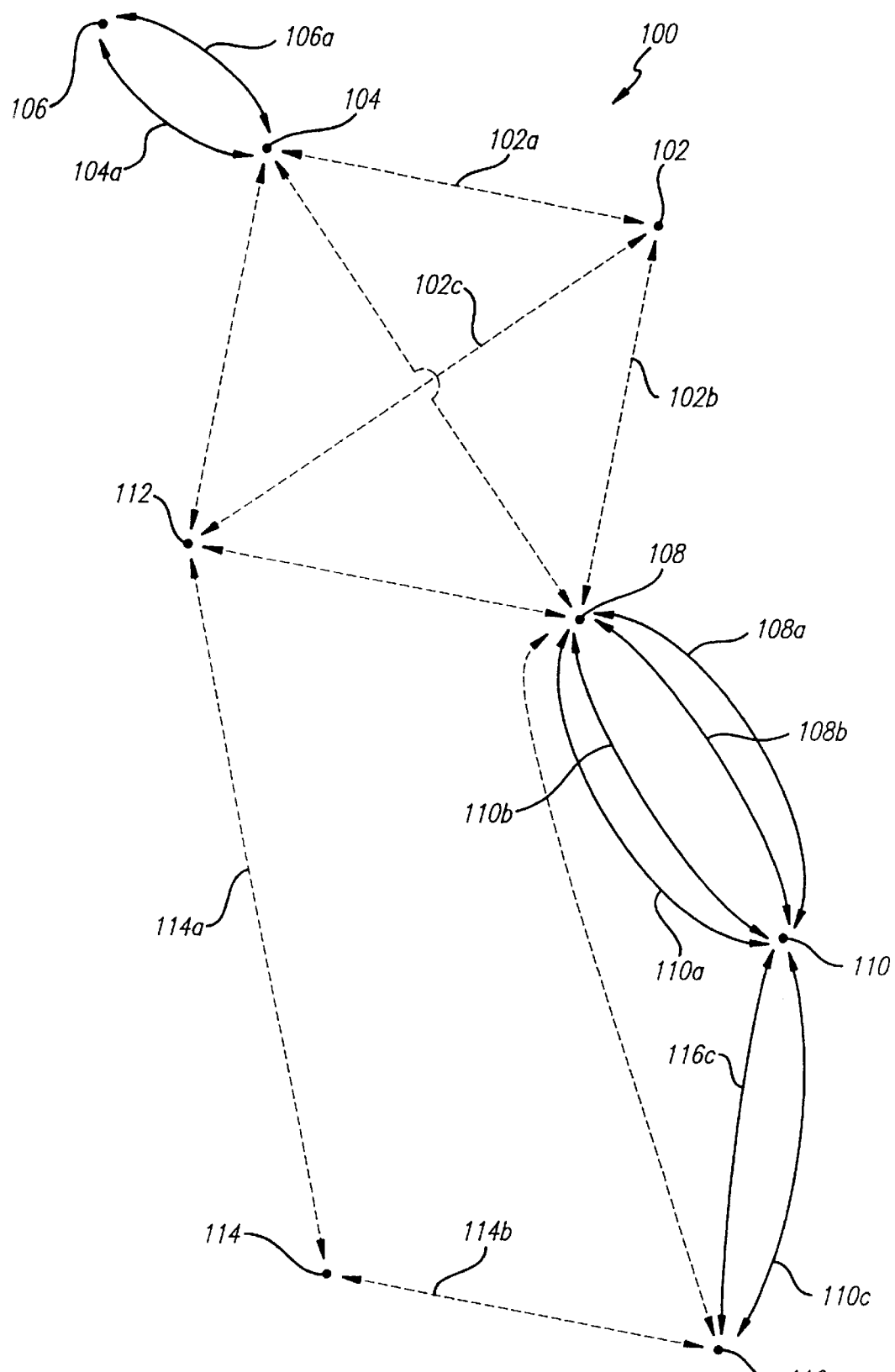
FIG. 7 illustrates a graph of the functions of the core space of FIGS. 2–6 according to one embodiment of the present invention.

Referring now to FIG. 7, a graph 100 is constructed where each of the vertices of the graph corresponds to a function, and each of the edges connecting the vertices represents the pieces which contain borders or overlapping areas of the functions (vertices) which it connects.

In the instant example, the vertices (102, 104, 106, 108, 110, 112, 114, and 116) of the graph 100 correspond to functions f1, f2, f3, f4, f5, f6, f7, and f8, respectively. Vertices are connected (by an edge) if the corresponding functions share at least one piece of the core. Continuing to refer to FIG. 7, for simplicity, each of the dashed lines of the figure indicates multiple edges connecting the vertices while each of the solid lines indicates a single connection between the vertices.

Continuing to refer to FIG. 7, dashed-line edges 102a, 102b, and 102c indicate that f1 (represented by vertex 102) shares at least one piece with each of the functions f2 (vertex 104), f4 (vertex 108), and f6 (vertex 112), respectively. Likewise, the dashed-line edges 114a and 114b indicate that f7 (represented by vertex 114) shares at least one piece of the core with functions f6 (vertex 112) and f8 (vertex 116), respectively.

The solid-line edges 104a and 106a show that functions f2 (vertex 104) and f3 (vertex 106) share piece P68 (see FIGS. 5 and 6) of the core. Two different edges are used to indicate sharing of one piece of the core between two functions (vertices). The first edge represents the capacity of the shared piece assigned to the first vertex (function), which is potentially available to the second vertex (function). The second edge represents the capacity of the shared piece assigned to the second vertex (function), which is potentially available to the first vertex (function).

For example, edge 104a, represents $X_{f2,P68}$ (the capacity of P68 assigned to f2). The same capacity, $X_{f2,P68}$, is also the maximum amount of capacity f2 may given up within P68 if f2 is found to have excess capacity. The direction of the arrow of edge 104a indicates the direction in which the capacity may be reallocated, or shifted.

Edge 104a is denoted as W(f3,f2,P68), and has the value $X_{f2,P68}$. Likewise, the edge 106a, denoted W(f2,f3,P68), has the value $X_{f3,P68}$, and represents the capacity of piece 68 assigned to f3 (vertex 106), which is potentially available to f2(vertex 104).

Referring primarily to FIG. 7 but also referring to FIGS. 5 and 6, vertices 108 and 110 (representing f4 and f5, respectively) have two pairs of edges (108a, 110a and 108b, 110b) connecting them because f4 and f5 share two different pieces, P82 and P84. In this case, the value of the edges are:

edge 108a, denoted W(f5,f4,P82), has the value $X_{f4,P82}$;
  edge 110a, denoted W(f4,f5,P82), has the value $X_{f5,P82}$;
  edge 108b, denoted W(f5,f4,P84), has the value $X_{f4,P84}$; and
  edge 110b, denoted W(f4,f5,P84), has the value $X_{f5,P84}$.

Step Six: Identify the Functions with Capacity Shortages and the Functions with Excess Capacity.

After building the graph 100, each of the vertices (functions) are analyzed and grouped into two sets of vertices V1 and V2. All functions (vertices) with deficiencies of capacity are assigned to group V1. All functions with a shortage of the core space satisfy the expression:

hh(f)>the sum of the capacities of all pieces which contribute core space to the function (i.e., the sum of all $X_{f,P}$ for all P belonging to $\Im(f)$).

In other words, V1 contains all vertices (functions) which do not have sufficient core space to place all of their cells.

The functions (vertices) with excess core space are assigned to V2. All functions with excess core space satisfy the expression:

hh(f)<sum of the capacities of all pieces which contribute core space to the function (i.e., the sum of all $X_{f,P}$ for all P belonging to $\Im(f)$).

In other words, V2 contains all vertices (functions) which have more than the core space needed to place their cells.

Step Seven: Shifting Excess Capacities to Meet Deficiencies.

For each of the vertices of V1, the graph 100 is traversed until a vertex belonging to V2 is encountered. The traversal is in the opposite direction of the arrows of the FIGS. 7 and 8 because the direction of the arrow indicates the direction in which the excess capacities can be shifted.

During the traversal, a chain of the vertices and the edges traversed is maintained. The chain begins with a first vertex (function, $f_{first}$) in V1 and ends in a second vertex (function, $f_{second}$) in V2.

The maximum capacity that can be shifted from $f_{second}$ to $f_{first}$, $\alpha$, is the smallest of the following three values:

1. the amount of the shortage of $f_{first}$, i.e. hh($f_{first}$)–(sum of the capacities of all P where P is a member of $\Im(f_{first})$);
2. the amount of excess capacity of $f_{second}$, i.e. (sum of capacities of all P where P is a member of $\Im(f_{second})$)–hh($f_{second}$);
3. the smallest maximum-capacity of any of the edges of the chain. The capacity of each of the edges is expressed as W(f1,f2,P).

After building the chain through which excess capacity of a piece can be shifted, the capacities of the each pieces of the chain, is updated as to shift the amount of capacity, represented by $\alpha$, from the second vertex ($f_{second}$) to the first ($f_{first}$) vertex by updating the edge values of each of the edges of the chain.

Figures 8, 9:
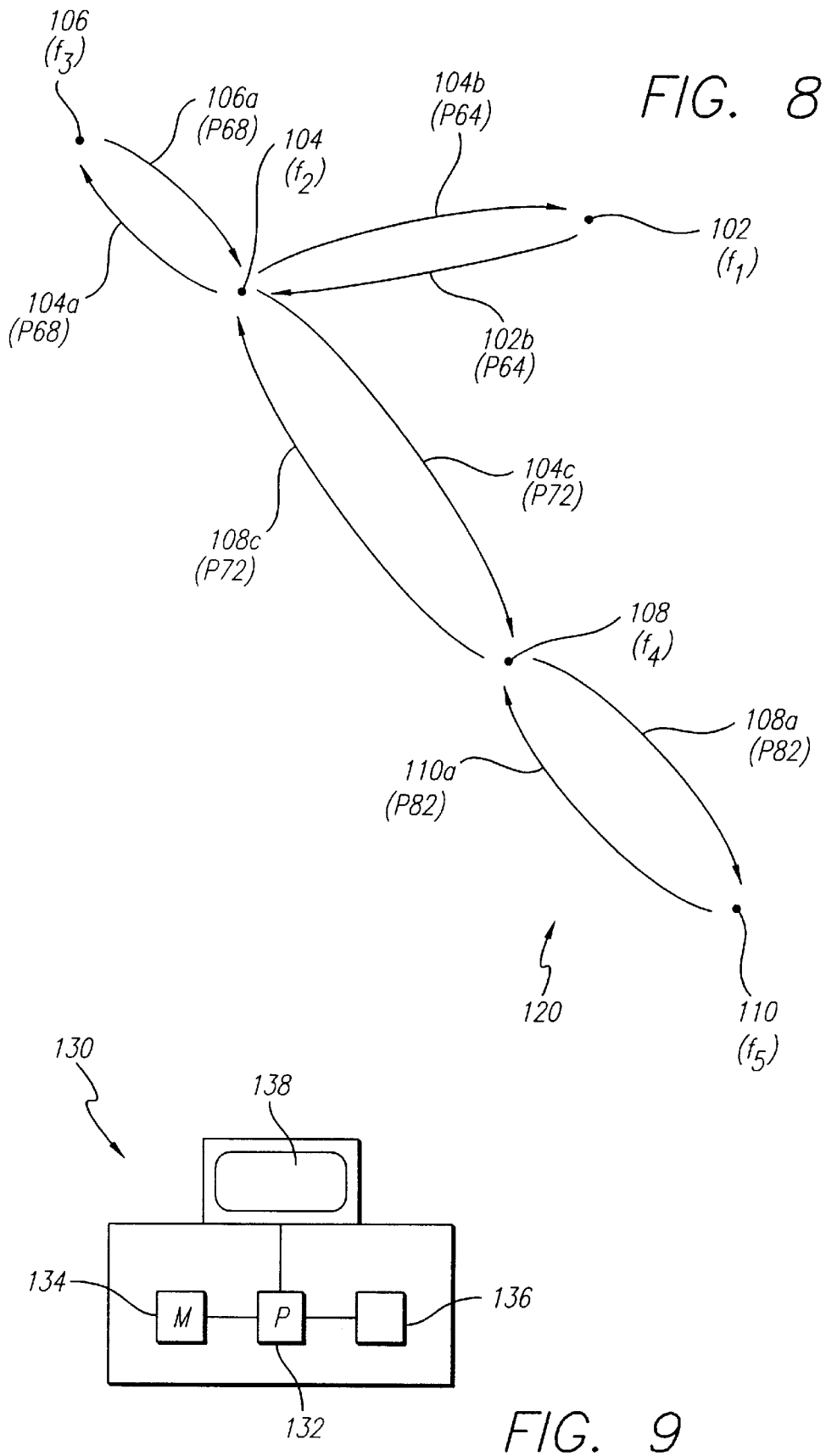
FIG. 8 illustrates a graph of the functions of the core space of FIGS. 2–6 showing capacity shifting in accordance with the present invention.
FIG. 9 illustrates an apparatus in accordance with a preferred embodiment of the present invention.

The process can best be illustrated using an example shown by FIG. 8. Referring primarily to FIG. 8, but also to FIGS. 2–6, the following facts are assumed for this illustration:

a. The vertices have the following properties:
  i. vertex 106 (representing f3 and belonging to set V1) is deficient by 500 cell height units. Alternatively expressed, hh(f3)>$X_{f3,P68}$ and hh(f3)–$X_{f3,P68}$=500 cell height units;
  ii. vertex 102 (f1, set V2) has 300 excess capacity;
  iii. vertex 110 (f5, V2) has 1200 excess capacity;
  iv. vertices 104 (f2) and 108 (f4) have no deficiencies or excess capacities.
b. The edges have the following properties:
  i. 104*a*=W(f3,f2,P68)=$X_{f2,P68}$=800 cell height units;
  ii. 102*b*=W(f2,f1,P64)=$X_{f1,P64}$=400 cell height units;
  iii. 108*c*=W(f2,f4,P72)=$X_{f4,P72}$=200 cell height units;
  iv. 110*a*=W(f4,f5,P82)=$X_{f5,P82}$=300 cell height units.

Given the graph 120 of FIG. 8 with above-listed facts, the 500 cell height unit deficiency of f3 can be remedied by shifting the capacities along the following two chains of the graph 120.

Chain 1:

Continuing to refer to FIG. 8 but also referring to FIGS. 2–6, the 300 excess capacity of f1 (vertex 102) can be shifted to f3 (vertex 106) via piece 64 (edge 102*b*), f2 (vertex 104), and piece 68 (edge 104*a*).

The chain can be denoted 102→102*b*→104→104*a*→106. The maximum capacity of the chain, $\alpha$, is the minimum of the following three numbers:

(1) 500, the deficiency of f3;
(2) 300, the amount of excess capacity of f1; and
(3) 400, the lowest maximum edge capacity of all of the edges of the chain, which, in this case, is from the edge 102*b*.

Therefore, the $\alpha$ of Chain 1 is 300.

The actual shifting of 300 cell height units from f1 (vertex 102) to f3 (vertex 106) is accomplished as follows:

(1) reallocating Xf1,P64 to be 300 units less than its previous value, thereby freeing space for cells of f2 in piece P64;
(2) reallocating Xf2,P64 to be 300 units more than its previous value, thereby taking the freed space, and creating an excess capacity of 300 units in f2;
(3) reallocating Xf2,P68 to be 300 units less than its previous value, thereby freeing space for cells of f3 in piece P68; and
(4) reallocating Xf1,P68 to be 300 units more than its previous value, thereby adding space for cells of f3 in piece P68, alleviating the shortage by 300 cell height units.

After the above-listed operations to shift 300 cell height units from f1 to f3, the shortage of capacity for f3 is reduced to 200 height units.

Chain 2:

The 200 units of 1200 excess capacity of function f5 can be shifted to f3 in a similar operation using Chain 2 which can be denoted 110→110*a*→108→108*c*→104→104*a*→106. The maximum capacity, $\alpha$, of Chain 2 is 200, the lowest maximum edge capacity of all of the edges of the chain, which, in this case, is from edge 108*c*.

The above described process is repeated for each of the vertices (functions) of the set V1 until no vertices remain in the set. Set V1 cannot be emptied if at least one vertex (function) of the set does not have sufficient core space to place all of its cells. In that case the placement is not possible under the given parameters.

Also, a vertex (function) cannot be reached to claim its excess core space when the total space assigned to the functions in the neighborhood is less than the minimal required to place the cells of the respective functions. To overcome this problem, the process disclosed by this document can be rerun after making one or more of the following changes:

the utilization of some or all of the neighboring functions can be increased;

the physical area assigned to the neighboring functions can be increased; or elementary region grid can be modified to create shared core space pieces encompassing the function and its neighboring functions.

Referring now to FIG. 9, an apparatus 130 for parallelizing net routing is illustrated. The apparatus 70 comprises a processor 132 and memory 134 connected to the processors for storing instructions for the processors 132. The memory stores the instructions for the processors to perform the above-discussed tasks. The harddrive 136, connected to the processor 132, contains the initial pin position information as well as the final floor plan layout which is produced as the result of the above-described operations. The final floor plan may be displayed by the monitor 138 which is also connected to the processor 132.

The specific algorithms described herein, as well as the basic steps which they represent (even if they are replaced by different algorithms), are designed for implementation in a general purpose computer. Furthermore, each of the algorithms described herein, as well as the basic steps it represents, can be encoded on computer storage media such as CD ROMS, floppy disks, computer harddrives, and other magnetic, optical, other machine readable media, whether alone or in combination with one or more of the algorithms and steps described herein.

Although the present invention has been described in detail with regarding the exemplary embodiments and drawings thereof, it should be apparent to those skilled in the art that various adaptations and modifications of the present invention may be accomplished without departing from the spirit and the scope of the invention. Thus, by way of example and not of limitation, the present invention is discussed as illustrated by the figures. Accordingly, the invention is not limited to the precise embodiment shown in the drawings and described in detail herein above.

We claim:

1. A method of allocating floor space of an integrated circuit (IC) chip, said method comprising the steps:

partitioning the IC into a grid comprising a plurality of regions;

defining pieces, each piece comprising at least one of said regions, and each piece having a capacity;

allocating said capacity of each of said pieces to a plurality of functions; constructing a graph having vertices and edges, each vertex representing one of said functions and each edge representing one of said pieces; and shifting an excess capacity of one of said functions to another one of said functions along the edges of said graph.

2. The method according to claim 1 further comprising the step of assigning each of said functions to a portion of the IC.

3. The method according to claim 1 wherein each of said functions comprises cells having heights, and each of said functions require capacity.

4. The method according to claim 3 wherein capacity of a first piece is allocated to a first function, capacity of a second piece is allocated to a second function, a first part of capacity of a third piece is allocated to said first function, and a second part of capacity of said third piece is allocated to said second function.

5. The method according to claim 4 further comprising the step of determining sufficiency of the sum of capacity of said first piece and said first part of capacity of said third piece to satisfy said capacity requirement of said first function.

6. The method according to claim 4 wherein said second part of capacity of said third piece is reallocated to said first function.

7. The method according to claim 3 further comprising the steps:

connecting a first vertex to a second vertex if said first vertex and said second vertex are assigned capacities from a first piece;

creating a first set of vertices, each vertex of said first set representing functions having a shortage of capacity which is more than the sum of capacities of said pieces allocated to said function of said first set;

creating a second set of vertices, each vertex of said second set representing functions having excess capacity which is less than the sum of capacities of said pieces allocated to said function of said second set;

traversing said graph, via said edges, beginning at a first vertex of said first set to a second vertex of said second set; and shifting excess capacities of said second vertex to alleviate said shortage of capacity of said first vertex.

8. The method according to claim 3 wherein said capacity requirement of each of said functions is the sum of said heights of cells of each of said functions.

9. The method according to claim 8 wherein said heights are fictive heights.

10. A computer implemented method of allocating floor space of an integrated circuit (IC) chip, said method comprising steps:

assigning a first function to a first portion of the IC;

assigning a second function to a second portion of the IC;

defining a grid comprising a plurality of regions;

defining a plurality of pieces, each piece comprising at least one region and belonging to same portions, and each piece having capacity;

assigning said capacities of a first set of pieces to said first function;

assigning said capacities of a second set of pieces to said second function;

said first portion and said second portion bordering on a border piece;

determining sufficiency of said capacities of said first set of pieces to implement said first function and sufficiency of said capacities of said second set of pieces to implement said second function;

constructing a graph having vertices and edges, each vertex representing one of said functions and each edge representing one of said pieces; and reassigning a part of said capacity of said first set of pieces from said first function to said second function by shifting the Dart of said capacity along the edges of said graph.

11. The method according to claim 10 wherein said border piece is determined by following steps:

partitioning the integrated circuit into a grid comprising a plurality of elementary regions;

defining pieces of the integrated circuit, each piece comprising a plurality of said elementary regions; and identifying pieces in which said first portion and said second portion border.

12. The method according to claim 10 further comprising step of partitioning the integrated circuit into a grid comprising a plurality of elementary regions; and wherein said pieces comprise a plurality of said elementary regions.

13. A method of allocating floor space of an integrated circuit, said method comprising steps:

a. assigning each of a plurality of functions to portions of the integrated circuit:

b. partitioning the integrated circuit into elementary regions;

c. defining pieces of the integrated circuit, each piece comprising a plurality of said elementary regions, and each piece having capacity;

d. determining capacities and utilizations of said pieces;

e. identifying bordering pieces within which at least two of said portions of the integrated circuit border;

f. allocating said capacity of a first piece to a function;

g. constructing a graph having vertices and edges, each vertex representing one of said functions and each edge representing one of said pieces; and h. reallocating said capacity of said first piece to another function by shifting said capacity along the edges of said graph.

14. The method as defined by claim 3 wherein each of said plurality of functions are implemented by a plurality of cells placed on the integrated circuit.

15. An apparatus for allocating floor space of an integrated circuit (IC) chip, said apparatus comprising:

a processor; and memory connected to said processor;

wherein said memory has instructions for said processor, and said instructions comprise the steps of;

partitioning the IC into a grid comprising a plurality of regions;

defining pieces, each piece having a capacity and comprising at least one of said regions;

allocating said capacity of each of said pieces to a plurality of functions;

constructing a graph having vertices and edges, each vertex representing one of said functions and each edge representing one of said pieces; and shifting an excess capacity of one of said functions to another one of said functions along the edges of said graph.

16. The apparatus according to claim 15 further comprising a storage device connected to said processor.

17. The apparatus according to claim 16 wherein said storage device is a computer harddrive.

18. The apparatus according to claim 15 wherein said memory further comprises instructions for said processors to reallocate already allocated capacity of each of said pieces to another function.

19. A computer storage medium containing instructions for a processor to allocate floor space of an integrated circuit, said instructions comprising the steps:

partitioning the IC into a grid comprising a plurality of regions;

defining pieces, each piece comprising at least one of said regions, and each piece having a capacity;

allocating said capacity of each of said pieces to a plurality of functions;

constructing a graph having vertices and edges, each vertex representing one of said functions and each edge representing one of said pieces; and shifting an excess capacity of one of said functions to another one of said functions along the edges of said graph.

20. The storage medium according to claim 19 wherein, said storage medium is selected from a group consisting of magnetic device, optical device, magneto-optical device, floppy diskette, CD-ROM, magnetic tape, computer harddrive, and memory card.

* * * * *